United States Patent
Barz et al.

(10) Patent No.: US 8,303,924 B2
(45) Date of Patent: Nov. 6, 2012

(54) PRODUCTION METHOD FOR A LOW-DISLOCATION BULK AlN SINGLE CRYSTAL AND LOW-DISLOCATION MONOCRYSTALLINE AlN SUBSTRATE

(75) Inventors: Ralph-Uwe Barz, Erlangen (DE); Thomas Straubinger, Erlangen (DE)

(73) Assignee: SiCrystal AG, Nuremberg (DE)

( * ) Notice: Subject to any disclaimer, the term of this patent is extended or adjusted under 35 U.S.C. 154(b) by 19 days.

(21) Appl. No.: 12/753,957

(22) Filed: Apr. 5, 2010

(65) Prior Publication Data

US 2010/0255305 A1    Oct. 7, 2010

(30) Foreign Application Priority Data

Apr. 3, 2009 (DE) .................. 10 2009 016 137

(51) Int. Cl.
| | |
|---|---|
| *B01D 11/00* | (2006.01) |
| *D02G 3/00* | (2006.01) |
| *C30B 9/00* | (2006.01) |
| *C30B 23/00* | (2006.01) |
| *C30B 25/00* | (2006.01) |
| *C23C 16/00* | (2006.01) |

(52) U.S. Cl. ............ 423/412; 428/401; 117/81; 117/88; 117/84; 118/726

(58) Field of Classification Search .................. None
See application file for complete search history.

(56) References Cited

U.S. PATENT DOCUMENTS

| | | | |
|---|---|---|---|
| 6,296,956 B1 * | 10/2001 | Hunter | ............ 428/698 |
| 2002/0170490 A1 | 11/2002 | Vodakov et al. | |
| 2005/0028725 A1 | 2/2005 | Kato et al. | |
| 2007/0240630 A1 | 10/2007 | Leonard et al. | |
| 2008/0149020 A1 | 6/2008 | Janzen et al. | |

FOREIGN PATENT DOCUMENTS

WO    2007/062250 A2    5/2007

OTHER PUBLICATIONS

B. Raghothamachar, et al., "X-ray Characterization of Bulk AlN Single Crystals Grown by the Sublimation Technique", Journal of Crystal Growth, 2003, pp. 244-250.

* cited by examiner

*Primary Examiner* — Melvin C Mayes
*Assistant Examiner* — Guinever Gregorio
(74) *Attorney, Agent, or Firm* — Laurence A. Greenberg; Werner H. Stemer; Ralph E. Locher

(57) ABSTRACT

A bulk AlN single crystal is grown on a monocrystalline AlN seed crystal having a central longitudinal mid-axis and disposed in a crystal growth region of a growing crucible. The bulk AlN single crystal grows in a growth direction oriented parallel to the longitudinal mid-axis by deposition on the AlN seed crystal. The crucible has a lateral crucible inner wall extending in the growth direction, a free space being provided between the AlN seed crystal and the growing bulk AlN single crystal on the one hand, and the lateral crucible inner wall on the other hand. Bulk AlN single crystals and monocrystalline AlN substrates produced therefrom are therefore obtained with only few dislocations, which furthermore are substantially distributed homogeneously. The growing crucible, inside which the crystal growth region is located, is an inner growing crucible which is arranged in an outer growing crucible. The two growing crucibles are provided with a crucible lid with a gap formed between the inner growing crucible and the crucible lid through which some of the AlN growth gas phase generated inside the crystal growth region escapes and is deposited on a crucible bottom of the outer growing crucible which lies opposite the crucible lid.

10 Claims, 2 Drawing Sheets

PRODUCTION METHOD FOR A LOW-DISLOCATION BULK ALN SINGLE CRYSTAL AND LOW-DISLOCATION MONOCRYSTALLINE ALN SUBSTRATE

CROSS-REFERENCE TO RELATED APPLICATION

This application claims the priority, under 35 U.S.C. §119, of German patent application DE 10 2009 016 137.6, filed Apr. 3, 2009; the prior application is herewith incorporated by reference in its entirety.

BACKGROUND OF THE INVENTION

Field of the Invention

The invention relates to a method for producing a bulk AlN single crystal and to a monocrystalline AlN substrate.

Owing to its outstanding physical, chemical, electrical and optical properties, the semiconductor material aluminum nitride (=AlN) is used inter alia as a starting material for electronic components, for example light-emitting semiconductor components, in particular nitride-based UV light-emitting diodes. The failure probability of these components increases with the defect density. Since defects, for example dislocations, propagate from the substrate into the epitaxially deposited layers, AlN substrates with low dislocation densities and a sufficient size are required in order to produce component systems with the fewest possible dislocations.

Dislocations occur, for example, as a result of mechanical stress fields in crystals. One frequent cause for the occurrence of such stresses consists in the different thermal expansion of various crystal regions owing to inhomogeneous thermal fields. Sometimes, this can also result in very different local dislocation densities. For example, the scientific article by B. Raghothamachar et al. "X-ray characterization of bulk AlN single crystals grown by the sublimation technique", Journal of Crystal Growth 250 (2003), pages 244-250, describes that the dislocation density in the edge region of a bulk AlN single crystal is often greater than at its center.

For the production of small semiconductor components having a base area in the range of a few $mm^2$, within an AlN substrate having an inhomogeneous defect distribution it is possible to select the regions with a sufficiently low defect density. This method, however, is unsuitable for large semiconductor components with a base area in the range of up to a few $cm^2$ or more. Instead, these require a better homogeneity, i.e. a consistently lower dislocation density over a larger area.

In order to produce low-defect bulk AlN single crystals, for example, maximally favorable growth conditions may be provided. Published international patent application WO 2007/062250 A2, however, also describes subsequent "annealing" of defects by means of a heat-treatment process, which results in bulk AlN single crystals having a defect density of less than $10^4$ $cm^{-2}$. Similar values are also mentioned in patent application publication US 2007/0101932 A1. However, the heat-treatment process can also lead to condensation of a plurality of dislocations and to the formation of very stable dislocation networks. Furthermore, it is not possible to control dislocation structures which, for example, are typical of low-angle grain boundaries, so that these bulk AlN single crystals have a relatively inhomogeneous defect density as before. For components which are applied onto regions of an AlN substrate with an elevated defect or dislocation concentration, this results in an increased failure probability.

SUMMARY OF THE INVENTION

It is accordingly an object of the invention to provide a production method for a low-dislocation AlN bulk monocrystal and a single crystal substrat with low dislocation which overcome the above-mentioned disadvantages of the heretofore-known devices and methods of this general type and which provides for an improved method for producing a bulk AlN single crystal, as well as an improved monocrystalline AlN substrate.

With the foregoing and other objects in view there is provided, in accordance with the invention, a method for producing a bulk AlN single crystal, which method comprises the following steps:

providing an outer growing crucible and an inner growing crucible inside said outer growing crucible, and a crucible lid for the inner and outer growing crucibles, with a gap formed between the inner growing crucible and the crucible lid, the outer growing crucible having a crucible bottom opposite from the crucible lid, and the inner growing crucible having a lateral crucible inner wall and a crystal growth region;

placing a monocrystalline AlN seed crystal having a central longitudinal mid-axis in the crystal growth region of the growing crucible;

growing the bulk AlN single crystal in a growth direction oriented substantially parallel to the lateral crucible inner wall and parallel to the longitudinal mid-axis by deposition on the AlN seed crystal;

maintaining a free space between the AlN seed crystal and the growing bulk AlN single crystal on one hand, and the lateral crucible inner wall on another hand; and allowing some of the AlN growth gas phase generated inside the crystal growth region for growing the bulk AlN single crystal to escape through the gap between the inner growing crucible and the crucible lid, and depositing on the crucible bottom of the outer growing crucible.

In other words, the objects of the invention are achieved with the novel method for producing a bulk AlN single crystal, in which a monocrystalline AlN seed crystal having a central longitudinal mid-axis is arranged in a crystal growth region of a growing crucible, and the bulk AlN single crystal grows in a growth direction oriented parallel to the longitudinal mid-axis by means of deposition on the AlN seed crystal, wherein the growing crucible has a lateral crucible inner wall extending in the growth direction, and a free space is provided between the AlN seed crystal and the growing bulk AlN single crystal on the one hand, and the lateral crucible inner wall on the other hand. The growing crucible, inside which the crystal growth region is located, is an inner growing crucible which is arranged in an outer growing crucible. The two growing crucibles are provided with crucible lid on the end so that between the inner growing crucible and the crucible lid, a gap is formed through which some of the AlN growth gas phase from which the bulk AlN single crystal grows by means of deposition escapes. The escaping part is deposited on a crucible bottom of the outer growing crucible which lies opposite the crucible lid.

It has been discovered that the lateral space or gap provided according to the invention between the crucible inner wall and the growing bulk AlN single crystal has a favorable effect on the quality of the growing bulk AlN single crystal, in particular its dislocation density. In the method according to the invention, in particular lateral growth of the bulk AlN single crystal is prevented. Owing to the lack of direct mechanical contact between the lateral crucible inner wall and the growing bulk AlN single crystal, mechanical stresses acting from the side are also not introduced into the growing bulk AlN single crystal. Owing to the different thermal expansion coefficients of the bulk AlN single crystal and the crucible inner wall, however, mechanical stresses coming from the side occur if direct contact takes place. This cause of the defect formation is avoided owing to the lateral space according to the invention between the crucible inner wall and the growing bulk AlN single crystal.

Because of the gap provided on the end of the crucible inner wall of the inner growing crucible, AlN gas species located in this region of the inner growing crucible can escape, so that accumulation on the crucible inner wall and therefore growth of the bulk AlN single crystal on the crucible inner wall can be prevented particularly well. The deposition of this escaping part of the AlN growth gas phase on the crucible bottom of the outer growing crucible is particularly efficient, and can be implemented very simply. A temperature which is relatively low, and therefore favors the deposition, can be set on this crucible bottom, for example by no longer arranging the crucible bottom in the immediate region of the effect of the normal crucible heating.

Overall, very low-defect bulk AlN single crystals can be produced by the growing method according to the invention, which on the one hand have only an extremely low global number of defects, in particular dislocations, and in which on the other hand these few defects or dislocations are distributed very homogeneously inside the volume of the bulk AlN single crystal. In particular, bulk AlN single crystals produced in this way no longer not exhibit the particularly detrimental dislocation clusters which occur in conventionally produced bulk AlN single crystals, for example in the edge region. The bulk AlN single crystals produced according to the invention therefore have a much higher quality and can also be further used better, particularly in order to produce semiconductor components.

According to a particular configuration, a radial distance in the range of between 0.5 mm and 2 mm, in particular about 1 mm, is provided for the space. In this way, on the one hand, the interior of the growing crucible is still utilized very efficiently in order to produce a bulk AlN single crystal with a large cross-sectional area in relation to the growth direction. On the other hand, these distance values ensure that the undesired mechanical contact between the crucible inner wall and the bulk AlN single crystal does not take place.

According to another particular configuration, the lateral crucible inner wall is additionally heated in a controlled way at least in the region of the AlN seed crystal and the growing bulk AlN single crystal. Owing to the high temperature which can thus be set on the crucible inner wall, the susceptibility to deposition decreases at this position so that growth of the bulk AlN single crystal on the lateral crucible inner wall is suppressed by this wall heating provided in addition to the normal crucible heating device. In particular, the heating device for controlled additional heating of the lateral crucible inner wall is arranged on an outer side of the crucible lid facing away from the AlN seed crystal. Here, there is enough room for the additional heating device. The crucible lid is provided on the end of the growing crucible in the growth direction, i.e. in the axial direction. The AlN seed crystal is applied on its inner side.

According to another particular configuration, inside the crystal growth region, perpendicularly to the growth direction, a radial temperature profile is set up in which a central temperature in the region of the longitudinal mid-axis is at most 5 K higher than an edge temperature on an edge of the AlN seed crystal or the growing bulk AlN single crystal, and the edge temperature is in particular at least 10 K higher than a wall temperature on the lateral crucible inner wall in the region of the AlN seed crystal or the growing bulk AlN single crystal. The effect achieved by this is that the material accumulation from the AlN growth gas phase provided in the crystal growth region takes place almost only on the growth interface of the growing bulk AlN single crystal, and not on the lateral crucible inner wall. Preferably a temperature profile with a small temperature gradient, for example in the range of between 1 K/cm and 30 K/cm, is set up on the growth interface and/or inside the bulk AlN single crystal. A phase boundary which is convex, i.e. slightly curved forward in the growth direction, is in particular set up. This will favor overall very low-defect or low-dislocation crystal growth.

According to another particular configuration, an axial gap width of at most 50 µm is provided for the gap. This ensures that although a small fraction of the AlN growth gas phase can escape laterally at the crucible inner wall through the gap, and undesired AlN accumulation is therefore avoided there, with said small gap width this escaping fraction is nevertheless still so small that the growth of the bulk AlN single crystal from the remaining (main) fraction of the AlN growth gas phase is not thereby significantly compromised.

According to another particular configuration, a subsaturated AlN gas phase is generated in the region of the free space between the AlN seed crystal and the growing bulk AlN single crystal on the one hand, and the lateral crucible inner wall on the other hand. This hinders the undesired deposition of AlN on the crucible inner wall.

According to another particular configuration, the monocrystalline AlN seed crystal is arranged with a rear side facing away from the growth direction on a seed support made of solid AlN material. In this case, neither the monocrystalline AlN seed crystal nor the growing bulk AlN single crystal comes in direct mechanical contact with any material other than AlN so that no mechanical stresses which are caused by different thermal expansion coefficients act on the growing bulk AlN single crystal. The AlN seed crystal is in particular suitably fastened, for example adhesively bonded or clamped, on the seed support.

According to another particular configuration, the bulk AlN single crystal is produced with a crystal length of at least 10 mm as measured in the growth direction. In this way, a particularly large number of wafer-like monocrystalline AlN substrates can be obtained from the bulk AlN single crystal for further use in order to produce semiconductor components.

With the above and other objects in view there is also provided, in accordance with the invention, a monocrystalline AlN substrate, comprising:

a main substrate surface with a diameter of at least 50 mm;

a global dislocation density, determined for an entire said main substrate surface, of at most $10^4$ cm$^{-2}$; and a local dislocation density, determined for any 4 mm$^2$ subsurface (in particular a square) of said main substrate surface, greater than said global dislocation density at most by a factor of two.

In other words, the objects of the invention with regard to the monocrystalline AlN substrate, are achieved by way of a monocrystalline AlN substrate that has a main substrate surface with a diameter of at least 50 mm, a global dislocation density determined for the entire main substrate surface is at most $10^4$ cm$^{-2}$, and a local dislocation density, determined for any 4 mm$^2$ large, in particular square subsurface of the main substrate surface, is greater than the global dislocation density at most by a factor of two.

The monocrystalline AlN substrate according to the invention, which is relatively large with a diameter of at least 50 mm, is thus distinguished in particular by an arrangement of the dislocations essentially distributed very uniformly in the radial direction, i.e. perpendicularly to the growth direction. Owing to this radially homogeneous distribution of the dislocations, the properties of the large AlN substrate are subject, if at all, to only very minor variations as seen over the main substrate surface. The substrate according to the invention can consequently be used with a high yield, for example as a substrate for the production of semiconductor components.

There have not previously been any monocrystalline AlN substrates which are so advantageous, with such a uniform distribution of the dislocations. They can for the first time be produced from the bulk AlN single crystals grown by means of the method according to the invention as described above for example by successive cutting or sawing of such bulk AlN single crystals wafer by wafer. The main substrate surface of such an AlN substrate is in particular oriented essentially perpendicularly to the growth direction of the bulk AlN single crystal.

The AlN substrate according to the invention fulfils the industrial requirements in respect of use for the production of semiconductor components. A substrate thickness of such an AlN substrate, measured perpendicular to the main substrate surface, lies particularly in the range of between about 100 µm and about 1000 µm, and preferably in the range of between about 200 µm and about 500 µm, the substrate thickness having a global thickness variation of preferably at most 20 µm as considered over the complete main substrate surface. Furthermore, at least one of the two mutually opposite main substrate surfaces has a surface roughness of preferably at most 3 nm. The AlN substrate is, in particular, self-supporting. It preferably has an essentially round wafer shape, i.e. the main substrate surface is almost round. Optionally, owing to at least one identification mark provided on the circumferential edge, there may be a slight deviation from the exactly circular geometry.

According to a particular configuration, the local dislocation density, which is at most a factor of two greater in comparison with the global dislocation density, applies for any 1 mm² large, in particular square subsurface of the main substrate surface. In this case, the monocrystalline AlN substrate thus has an even greater homogeneity of the density distribution of the dislocations. The quality and further usability of the AlN substrate are therefore additionally improved.

According to another particular configuration, the main substrate surface has a diameter of at least 75 mm, in particular at least 100 mm, and preferably at least 200 mm. The larger the substrate diameter is, the more efficiently the monocrystalline AlN substrate can be used further for the production of semiconductor components. This reduces the production costs for the semiconductor components. The inventive substantially homogeneous radial distribution of the dislocations can in particular even be achieved with comparatively large monocrystalline AlN substrates. An AlN substrate having such a large diameter can advantageously also be used for the production of relatively large semiconductor components, which have for example a base area of about 1 cm². However, this simultaneously entails a more stringent requirement for the homogeneity of the AlN substrate, since a semiconductor component is to be considered as a reject as soon as there is a region with a locally increased dislocation density within the base area of the semiconductor component. The probability of this increases when the semiconductor component is larger. For producing small components having a base area of only a few mm², simply those components which lie on substrate zones with defect clusters are classed as rejects, while the components lying between them can be used. For large components, however, this selection method is not possible, or possible only to a limited extent. Owing to the large base area, it is possible for almost all the components to contain subzones having the particularly detrimental defect clusters, and therefore to be unusable. Specifically for the production of large components, it is therefore crucially important to avoid such subzones with defect clusters inside the AlN substrate from the start. The AlN substrate according to the invention, having few very homogeneously distributed dislocations (=defects) thus favors the production of large components.

According to another particular configuration, the global and local dislocation densities respectively specify in a surface-referenced way how many dislocations of at least one dislocation type, from the group comprising step dislocation, screw dislocation and basal plane dislocation, are present in the crystal structure of the AlN substrate and can be detected on the main substrate surface. In particular, the global and local dislocation densities specify dislocations of any type which are present in the crystal structure of the monocrystalline AlN substrate and can be detected on the main substrate surface, and in particular for dislocations of one type or alternatively for all dislocations irrespective of the type in question. Both the global and local dislocation densities are thus surface-referenced quantities. The AlN substrate according to the invention has only very few dislocations of each individual type, and the total number of all dislocations is also extremely low. Furthermore, the dislocations of the individual types and all the dislocations, irrespective of the dislocation type in question, are distributed substantially homogeneously inside the AlN substrate. In particular, there are no dislocation clusters which would otherwise greatly reduce the quality of the AlN substrate.

Other features which are considered as characteristic for the invention are set forth in the appended claims.

Although the invention is illustrated and described herein as embodied in a production method for a low-dislocation bulk aln single crystal and low-dislocation monocrystalline AlN substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
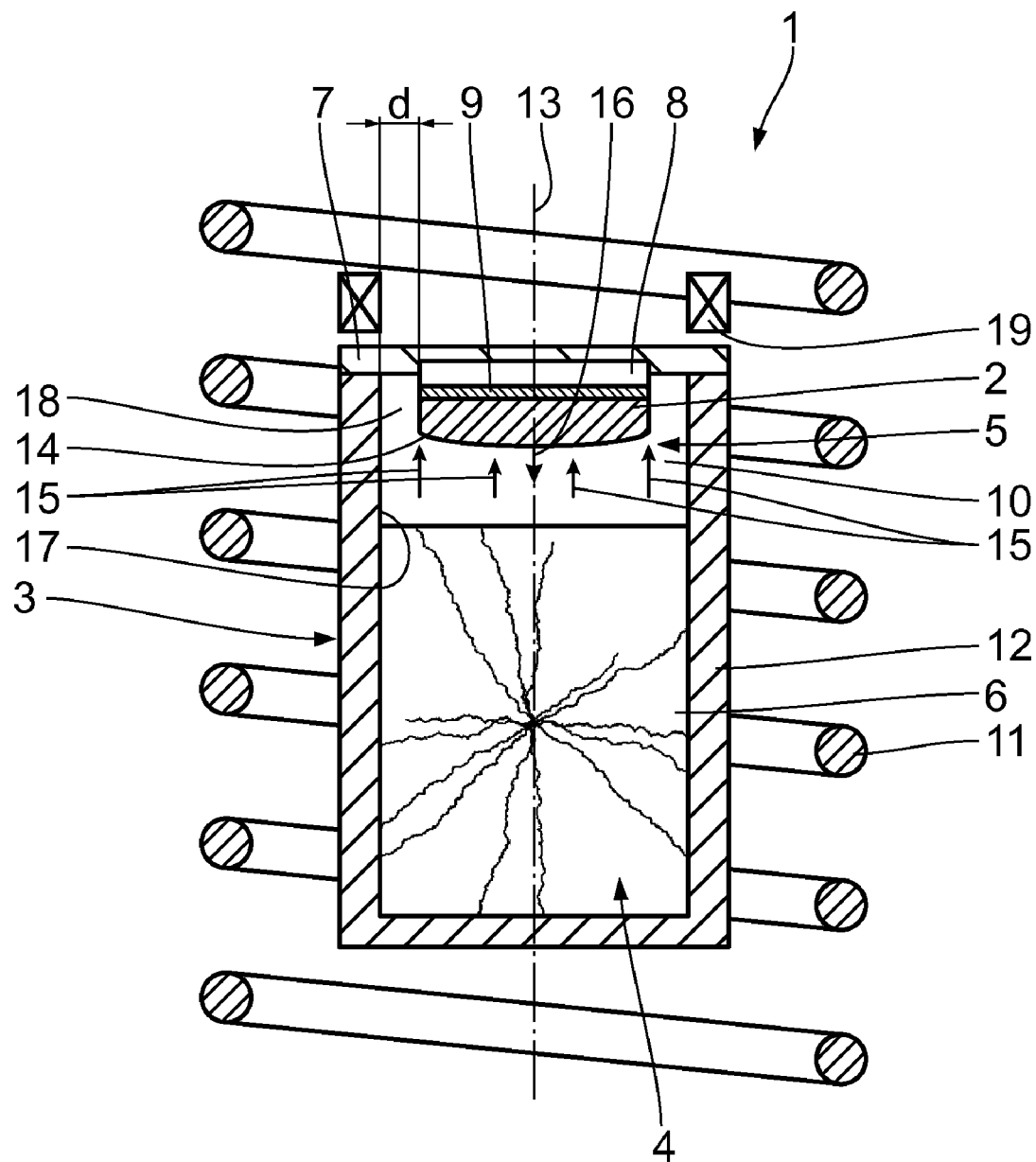
FIG. 1 is a sectional view illustrating a first exemplary embodiment of a growing configuration for the production of a bulk AlN crystal without mechanical contact with the lateral crucible inner wall.

Referring now to the figures of the drawing in detail and first, particularly, to FIG. 1 thereof, there is shown an exemplary embodiment of a growing configuration 1 for the production of a bulk AlN crystal 2 by way of sublimation growth. The growing configuration 1 includes a growing crucible 3, which comprises an AlN supply region 4 and a crystal growth region 5. The AlN supply region 4 contains for example powdered AlN source material 6, with which the AlN supply region 4 of the growing crucible 3 is filled as a prefabricated starting material before the start of the growing process. As an alternative, the AlN source material 6 may also be configured as a sintered polycrystalline AlN block or as a polycrystalline or monocrystalline resublimed AlN material.

On an opposite side from the AlN supply region 4, the growing crucible 3 is closed off by an end crucible lid 7. A seed support 8 made of a solid AlN material is arranged on its lid on a side facing toward the crucible interior. To this end a recess is provided on the inner side of the lid, into which the seed support 8 is fitted so that it protrudes with its seed contact face some way into the crucible interior, or the crystal growth region 5. A monocrystalline AlN seed crystal 9, placed on the seed contact face of the seed support 8, does not then come in contact with the material of the crucible lid 7. The AlN seed crystal 9 is defect-free or at least extremely low in defects, in order to substantially prevent defects of the AlN seed crystal 9 from propagating in the growing bulk AlN single crystal 2. Here, defects are also intended above all to mean dislocations in the crystal structure.

On the AlN seed crystal 9, the bulk AlN single crystal 2 to be produced grows by means of deposition from an AlN growth gas phase 10 which is formed in the crystal growth region 5. The growing bulk AlN single crystal 2 and the AlN seed crystal 9 have approximately the same diameter. If at all, there is a deviation of at most 10% by which the diameter of the AlN seed crystal 9 is smaller than the diameter of the bulk AlN single crystal 2.

In the exemplary embodiment according to FIG. 1, the growing crucible 3 comprises a suitable electrically and thermally conductive graphite crucible material, in particular a high-melting metal such as for example tantalum and/or tungsten, or a compound of such a high-melting metal with nitrogen and/or carbon. As an alternative, it is also possible to configure the growing crucible 3 in several parts, in which case at least some of the individual parts may consist of different crucible materials. To this extent, other suitable crucible materials, for example graphite, may thus be provided besides the crucible materials mentioned. A thermal insulation layer (not shown in detail) is arranged around the growing crucible 3.

The thermally insulated growing crucible 3 is placed inside a tubular container (likewise not shown in detail), which is configured for example as a quartz glass tube and forms an autoclave or reactor. In order to heat the growing crucible 3, an inductive heating device in the form of a heating coil 11 is arranged around the tubular container. The heating coil 11 couples an electric current inductively into an electrically conductive crucible wall 12 of the growing crucible 3. This electric current flows essentially as a circular current in the circumferential direction inside the hollow cylindrical crucible wall 12, and thereby heats up the growing crucible 3. The relative positions of the heating coil 11 and the growing crucible 3 can optionally be varied axially, i.e. in the direction of a longitudinal mid-axis 13 of the AlN seed crystal 9 and the growing bulk AlN single crystal 2, particularly in order to set the temperature or the temperature profile inside the growing crucible 3, and if need be also change it. The growing crucible 3 is heated to temperatures of more than 2000° C. by means of the heating coil 11.

The AlN growth gas phase 10 in the crystal growth region 5 is supplied by the AlN source material 6. The AlN growth gas phase 10 contains at least gas constituents in the form of Al and $N_2$ (=AlN gas species). The transport from the AlN source material 6 to the, in particular, convex growth interface 14 of the growing bulk AlN single crystal 2 takes place along an axial temperature gradient. This material transport in the direction of the bulk AlN single crystal 2 is symbolized by the transport arrows 15 in the representation according to FIG. 1. The temperature inside the growing crucible 3 decreases in the axial direction toward the growing bulk AlN single crystal 2. The bulk AlN single crystal 2 grows in a growth direction 16, which is oriented from the top downward in the exemplary embodiment shown in FIG. 1, i.e. from the crucible lid 7 to the AlN supply region 4 arranged underneath. The growth direction 16 extends parallel to the central longitudinal mid-axis 13. Since the growing bulk AlN single crystal 2 is arranged concentrically inside the growing configuration 1 in the exemplary embodiment shown, the central longitudinal mid-axis 13 may also be attributed overall to the growing configuration 1.

The AlN seed crystal 9 and the growing bulk AlN single crystal 2 are separated from a lateral crucible inner wall 17 of the growing crucible 3, which extends in the growth direction 16. A free space 18 is provided in the form of an annular gap, the radial distance d of which is about 1 mm. This space 18 is maintained throughout the growing process, so that no mechanical contact can take place between the AlN seed crystal 9 and the growing bulk AlN single crystal 2 on the one hand, and the lateral crucible inner wall 17 on the other hand. For this reason, and also owing to the seed support 8 interposed on the inner side of the crucible lid 7, mechanical stresses do not act on the crystal structure of the bulk AlN single crystal 2 either from the side, i.e. from the circumference, or from the axial end. Such stresses could otherwise occur owing to different thermal expansion coefficients of materials which are in mechanical contact with one another, and lead to increased formation of defects, in particular dislocations. Such increased defect formation would take place above all in the crystal edge region, which will be particularly affected by said mechanical stresses. The growth of the bulk AlN single crystal 2, however, takes place almost without stress so that it grows to be very low in defects and homogeneously. Above all, in its edge region it does not have the inhomogeneous clustering of defects, in particular dislocations, to be observed in the prior art.

An auxiliary heating device 19 is furthermore provided, which is arranged on an outer side of the crucible lid 7 facing away from the AlN seed crystal 9 and by means of which the crucible inner wall 17 can be additionally heated in a controlled way at least in the region of the free space 18, i.e. in the region of the AlN seed crystal 9 and the growing bulk AlN single crystal 2. In this way, a wall temperature $T_1$ can be set on the crucible inner wall which is somewhat, in particular at least 10 K, higher than an edge temperature $T_2$ on a circumferential edge of the AlN seed crystal 9 or the growing bulk AlN single crystal 2. Gas species of the AlN growth gas phase 10 are therefore preferentially deposited on the cooler growth interface 14, so as to bring about the desired crystal growth there. At the same time, however, it also prevents the free space 18 from being constricted by growth during the growth process. The latter is additionally avoided by generating an in particular subsaturated AlN gas phase (=feed phase) in the region of the free space 18. The susceptibility to deposition in this region is therefore reduced further.

An only very small temperature gradient is preferably set up on the growth interface 14, which in particular is less than that in the region of the free space 18, preferably by at least a factor of 2, in particular by a factor of 5. Thus, a central temperature $T_3$ in the region of the longitudinal mid-axis 13 is at most 5 K higher than the edge temperature $T_2$. The radial temperature profile, provided perpendicularly to the growth direction 16, is thus characterized by an only very moderate temperature decrease toward the lateral circumferential edge of the AlN seed crystal 9 or the growing bulk AlN single crystal 2. The thermal fields prevailing in or on the bulk AlN single crystal 2 are therefore substantially homogeneous. This favors very low-defect and homogeneous growth of the bulk AlN single crystal 2.

Figure 2:
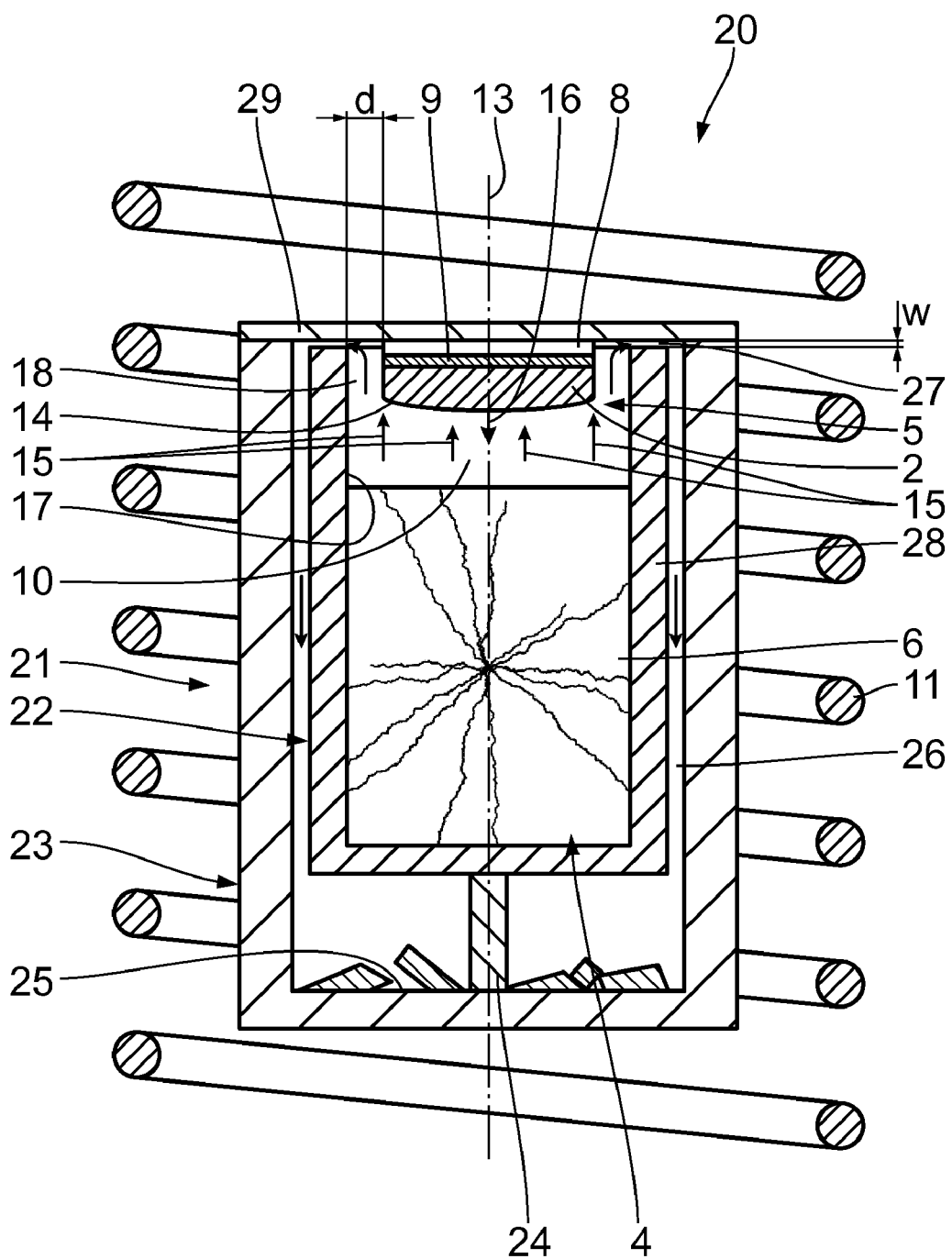
FIG. 2 is a similar view of a second exemplary embodiment of a growing configuration for the production of a bulk AlN crystal without mechanical contact with the lateral crucible inner wall.

FIG. 2 represents another exemplary embodiment of the growing configuration 20 for producing a bulk AlN single crystal 2 by means of sublimation growth. The growing configuration 20 differs from the growing configuration 1 according to FIG. 1 above all by the structure of the growing crucible. The growing configuration 20 has a double crucible 21 with an inner growing crucible 22 holding the crystal growth region 5 and the AlN supply region 4, and an outer growing crucible 23 in which the inner growing crucible 22 is placed. The inner growing crucible 22 is supported by means of a prop 24 against a crucible bottom 25 of the outer growing crucible 23.

A hollow cylindrical flow channel 26, which surrounds the inner growing crucible 22, is formed between the inner growing crucible 22 and the outer growing crucible 23. It is in communication with the interior of the inner growing crucible 22 through an outlet gap 27. The outlet gap 27 has an axial gap width w of at most 50 μm. It is formed on the axial end between the lateral crucible wall 28 of the inner growing crucible 22 and a common crucible lid 29, which in the exemplary embodiment according to FIG. 2 covers both the outer growing crucible 23 and the inner growing crucible 22. The crucible lid 29 is also used for fastening the AlN seed crystal 9 by means of the seed support 8 consisting of solid AlN, as already explained for the crucible lid 7 of the growing configuration 1.

Some of the AlN growth gas phase 10 generated inside the crystal growth region 5 escapes from the inner growing crucible 22 through the outlet gap 27 and travels through the flow channel 26 to the comparatively cold crucible bottom 25, on which deposition takes place. This escaping part of the AlN growth gas phase 10 flows around the growing bulk AlN single crystal 2 on its way to the outlet gap 27. The flow path extends precisely through the free space 18, which is also provided as an essential component in the growing configuration 20, between the AlN seed crystal 9 and the growing bulk AlN single crystal 2 on the one hand, and the lateral crucible inner wall 17 of the inner growing crucible. The gas flow also contributes to preventing the space 18 from being constricted by growth during the growth process, so that a very low and substantially homogeneously distributed defect concentration can be achieved in the growing bulk AlN single crystal 2.

From a bulk AlN single crystal 2 produced by means of the growing configuration 1 or 20, which owing to the described favorable growth conditions is very low in defects, in particular very low in dislocations, and furthermore grows very homogeneously, monocrystalline AlN substrates which differ scarcely or not at all from one another in their properties can advantageously be produced. All such AlN substrates are obtained from the bulk AlN single crystal 2 by successively cutting or sawing it axially as wafers perpendicularly to the growth direction 16, or the longitudinal mid-axis 13. These AlN substrates differ almost not at all from one another in their properties. In particular, they each have a very low dislocation density, the few remaining dislocations substantially being distributed homogeneously in relation to a main substrate surface. This applies both for each dislocation type and for all dislocation types together. Essentially, three different dislocation types occur, namely step dislocations, screw dislocations and basal plane dislocations. These dislocations occur with a frequency (=global dislocation density) of at most $10^4$ cm$^{-2}$ in the AlN substrates produced from the grown bulk AlN single crystal 2, so that these AlN substrates are very highly suitable for use for the production of semiconductor components.

Apart from the low frequencies of the individual dislocation types taken per se, as well as all dislocations as a whole, these dislocations are also substantially distributed homogeneously inside the respective AlN substrate. Thus, any 4 mm$^2$ large and preferably even any 1 mm$^2$ large square subsurface of the main substrate surface has a local dislocation density, determined for this subsurface, which is at most a factor of two larger than the global dislocation density. This applies both for each dislocation type and also, considered together, all dislocation types. The particularly detrimental dislocation clusters which are always to be observed in previously known AlN substrates, above all in the edge region, therefore no longer occur in the AlN substrates. This is a considerable advantage, since the AlN substrates obtained from the bulk AlN single crystal 2 can therefore be used much better and more efficiently for the production of semiconductor components. The reject rate resulting during component production is therefore drastically reduced.

The invention claimed is:

1. A method for producing a bulk AlN single crystal, the method which comprises:
providing an outer growing crucible and an inner growing crucible inside said outer growing crucible, and a crucible lid for the inner and outer growing crucibles, with a gap formed between the inner growing crucible and the crucible lid, the outer growing crucible having a crucible bottom opposite from the crucible lid, and the inner growing crucible having a lateral crucible inner wall and a crystal growth region;
placing a monocrystalline AlN seed crystal having a central longitudinal mid-axis in the crystal growth region of the growing crucible;
growing the bulk AlN single crystal in a growth direction oriented substantially parallel to the lateral crucible inner wall and parallel to the longitudinal mid-axis by deposition on the AlN seed crystal;
maintaining a free space between both AlN crystals and the lateral crucible inner wall;
allowing some of the AlN growth gas phase generated inside the crystal growth region for growing the bulk AlN single crystal to escape through the gap between the inner growing crucible and the crucible lid, and depositing on the crucible bottom of the outer growing crucible; and
setting up a radial temperature profile inside the crystal growth region, perpendicularly to the growth direction, the radial temperature profile having a central temperature in a region of the longitudinal mid-axis at most 5 K higher than an edge temperature on an edge of the AlN seed crystal or the growing bulk AlN single crystal.

2. The method according to claim 1, which comprises maintaining the free space with a radial distance in a range of between 0.5 mm and 2 mm.

3. The method according to claim 2, which comprises setting the radial distance of the free space to approximately 1 mm.

4. The method according to claim 1, which comprises additionally heating the lateral crucible inner wall in a controlled way at least in a region of the AlN seed crystal and the growing bulk AlN single crystal.

5. The method according to claim 4, wherein the AlN seed crystal is disposed on an inside of the crucible lid, and an additional heating device for controlled additional heating of the lateral crucible inner wall is arranged on an outer side of the crucible lid facing away from the AlN seed crystal.

6. The method according to claim 1, which comprises setting up the radial temperature profile with the edge temperature at least 10 K higher than a wall temperature on the lateral crucible inner wall in the region of the AlN seed crystal or the growing bulk AlN single crystal.

7. The method according to claim 1, which comprises setting an axial gap width of the gap to at most 50 μm.

8. The method according to claim 1, which comprises generating a subsaturated AlN gas phase in a region of the free space between the AlN seed crystal and the growing bulk AlN single crystal on the one hand, and the lateral crucible inner wall on the other hand.

9. The method according to claim 1, which comprises placing the monocrystalline AlN seed crystal with a rear side facing away from the growth direction on a seed support made of solid AlN material.

10. The method according to claim 1, which comprises producing the bulk AlN single crystal with a crystal length of at least 10 mm as measured in the growth direction.

* * * * *